United States Patent [19]
Aipperspach et al.

[11] Patent Number: 5,835,502
[45] Date of Patent: Nov. 10, 1998

[54] METHOD AND APPARATUS FOR HANDLING VARIABLE DATA WORD WIDTHS AND ARRAY DEPTHS IN A SERIAL SHARED ABIST SCHEME

[75] Inventors: Anthony Gus Aipperspach; Todd Alan Christensen; Leland Leslie Day; Paul Allen Ganfield, all of Rochester, Minn.; Murali Vaddigiri, Smithtown, N.Y.; Paul Wong, Rochester, Minn.

[73] Assignee: International Business Machines Corporation, Armonk, N.Y.

[21] Appl. No.: 673,258

[22] Filed: Jun. 28, 1996

[51] Int. Cl.⁶ .................................................. G06F 11/00
[52] U.S. Cl. ................................................. 371/21.1
[58] Field of Search ............................... 371/21.1, 21.2, 371/21.4, 21.6; 395/183.06

[56] References Cited

U.S. PATENT DOCUMENTS

| | | |
|---|---|---|
| 3,961,254 | 6/1976 | Cavaliere et al. . |
| 4,234,934 | 11/1980 | Thorsrud . |
| 4,675,808 | 6/1987 | Grinn et al. . |
| 4,873,671 | 10/1989 | Kowshik et al. . |
| 4,972,417 | 11/1990 | Sako et al. . |
| 5,001,669 | 3/1991 | Cho et al. . |
| 5,210,839 | 5/1993 | Powell et al. . |
| 5,237,672 | 8/1993 | Ing-Simmons et al. . |
| 5,396,608 | 3/1995 | Garde . |
| 5,404,474 | 4/1995 | Crook et al. . |

FOREIGN PATENT DOCUMENTS

| | | |
|---|---|---|
| 63-197151 | 8/1988 | Japan . |
| 0 632 467 A1 | 4/1995 | WIPO . |

*Primary Examiner*—Vincent P. Canney
*Attorney, Agent, or Firm*—Merchant, Gould, Smith, Edell, Welter & Schmidt; Tyler L. Nasiedlak

[57] ABSTRACT

A method and apparatus for handling variable data word widths and array depths in an array built-in self-test system for testing a plurality of memory arrays using a single controller. Each array includes a predetermined row and column address depth and data word width. Each array further includes a scan register. A universal test data word is generated and sent to the scan register of each array. The universal length test data word has a length dependent upon the maximum row address depth, maximum column address depth and/or the maximum data word width. A portion of the test data word which exceeds the column address depth, row address depth and/or the data word width of a particular array is shifted off the end of the scan register of the particular array.

30 Claims, 13 Drawing Sheets

METHOD AND APPARATUS FOR HANDLING VARIABLE DATA WORD WIDTHS AND ARRAY DEPTHS IN A SERIAL SHARED ABIST SCHEME

FIELD OF THE INVENTION

The present invention relates generally to built-in self-testing of memory arrays, and more particularly, to a method and apparatus for handling variable data word widths and array depths in a built-in self-test for multiple arrays embedded in an integrated circuit using a single controller.

BACKGROUND OF THE INVENTION

Built-in self-testing of integrated circuits is accomplished by adding a small amount of logic to the integrated circuit to enable the circuit to test itself. Such testing allows the integrated circuit to be tested at speed, more cheaply, and more thoroughly than conventional methods.

Built-in self-testing of memory arrays (ABIST) allows the self-testing of arrays when the array is surrounded by other circuitry on the chip such that the array is not directly accessible, either in whole or in part, from the input and output pads of the chip. Conventional ABIST schemes rely on scannable latches disposed at the boundary of an array. The latches hold write data, read data, and addresses for the write data and the read data. A dedicated controller is used to send write data and address data, the write data and address data being tailored to the data word width and address depth of the array, respectively.

As integrated circuit chip densities increase, more memory arrays are embedded within a single chip. These memory arrays may have variable data word widths and address sizes. Typically, one controller is dedicated to each array. In order to save space, the use of a single controller for testing all memory arrays on a chip would be desirable. However, conventional controllers are not capable of handling the variable data word widths and array sizes which typically exist on multiple memory chips.

Consequently, there exists in the electronics industry a need for an apparatus and method for handling variable data word widths and array depths in a built-in self-test for multiple arrays embedded in an integrated circuit using a single controller. The present invention addresses this and other needs.

SUMMARY OF THE INVENTION

To overcome the limitations in the prior art described above, and to overcome other limitations that will become apparent upon reading and understanding the present specification, the present invention discloses a method and apparatus for handling variable data word widths and array depths in an array built-in self-test system for testing a plurality of memory arrays using a single controller.

The present invention solves the above-described problems by providing a universal length test data word which is sent to each array in a chip.

In accordance with the principles of the present invention, each array has a predetermined row and column address depth and data word width. Each array further includes a scan register. To handle variable data word widths and array depths, a universal test data word is generated and sent to the scan register of each array.

In accordance with one aspect of the present invention, the test data word comprises an address data block having a length dependent upon the maximum row address depth and maximum column address depth of the arrays.

In accordance with a further aspect of the present invention, in one embodiment, the scan register includes an address register, and dummy latches are added to the address register of each array having a row address depth less than the maximum row address depth or column address depth less than the maximum column address depth. In an alternate embodiment, the address data block includes a row address data block and a column address data block and the scan register includes a row address register and a column address register. The row address data block is sent to the row address register along a first line and the column address data block is sent to the column address register along a second line.

In accordance with a further aspect of he present invention, the test data includes a write data block having a length dependent upon the maximum data word width of the arrays. The scan register of each array includes a write register having an end, and as the test data word is sent to each array, a portion of the write data block falls off the end of the write register in each array which has a data word width less than the maximum data word width.

In accordance with a further aspect of the present invention, each array has read latches for holding read data. The read data is scanned out of the latches and padded with known data.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout:

FIG. 3A–1–2 is a block diagram illustrating further detail of the test data word and the memory arrays shown in FIG. 1.

DETAILED DESCRIPTION OF THE EMBODIMENTS

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides an array built-in self-test system which generates a universal length test data word and sends the test data word to each array in a chip.

Figure 1:
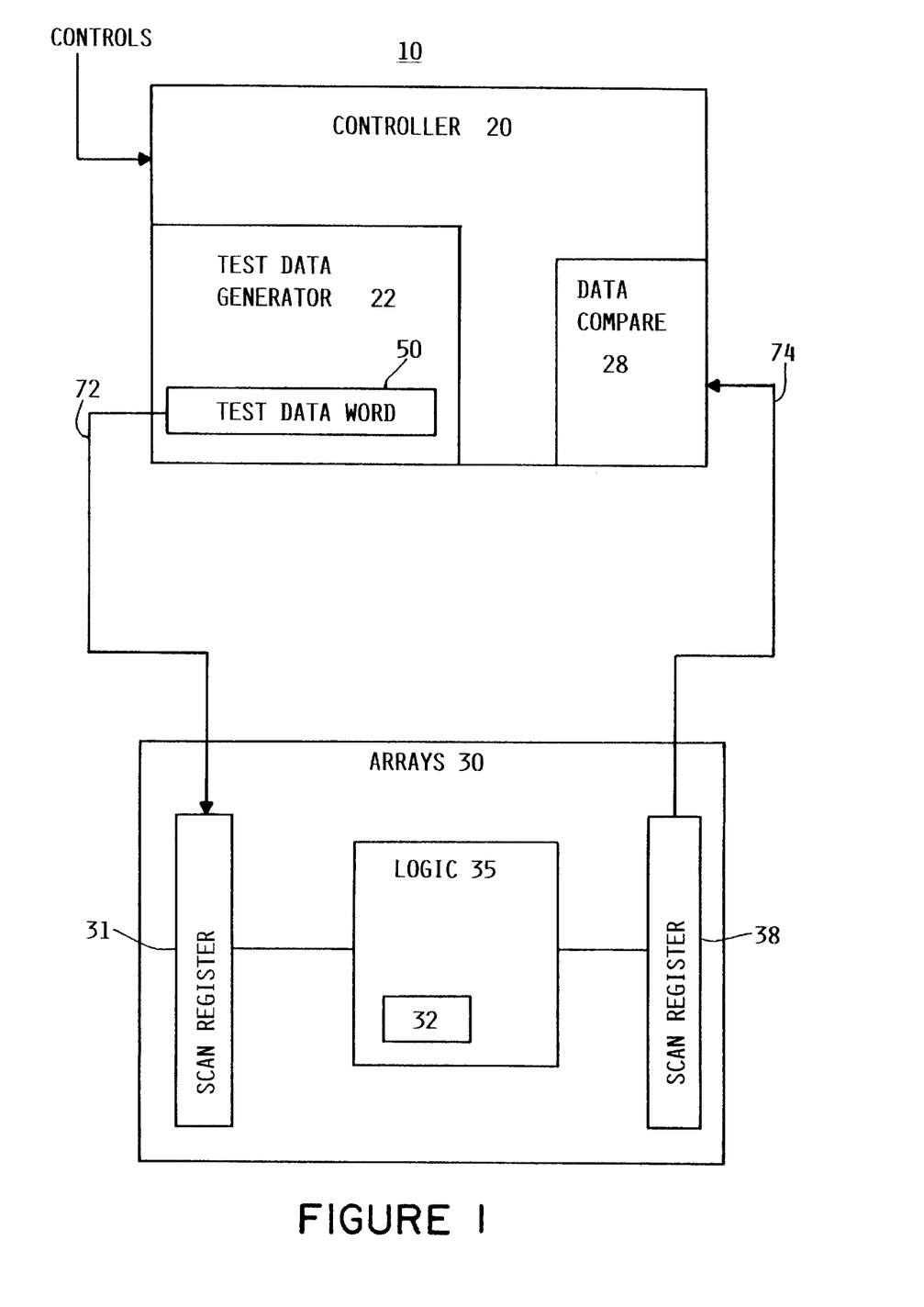
FIG. 1 is a block diagram illustrating an exemplary array built-in self-test system according to the principles of the present invention.

FIG. 1 illustrates, in block form, an array built in self test (ABIST) system of the present invention, which shows the main functional elements of the system formed on a semiconductor chip 10, which may be made of silicon. Chip 10 includes a plurality of embedded arrays 30 interfacing with a self-test controller 20. Each memory array 30 includes a number of blocks, each block comprising a matrix of cells. The address of a cell is identified by a row address and a column address. The identical cells within each block collectively form a word. The width of the word, i.e. the data word width, corresponds to the number of blocks in the array. The number of rows in an array block will be referred to as the row address depth, and the number of columns in an array block will be referred to as the column address depth. Moreover, each memory array may be either a dynamic random access memory (DRAM) array or a static random access memory (SRAM).

Controller 20 interfaces with arrays 30 through scan registers 31. Each scan register 31 generally includes a plurality of shift register latches holding read/write control data, address data, and write data. Controller 20 controls a test data generator 22 which generates a test data word 50 that includes write data, address data and read/write control data. Test data word 50 may also be held in a plurality of shift register latches and is serially scanned out along line 72 and serially received by the scan register 31 of each array 30 in parallel.

Each array 30 includes logic 35 for interpreting read/write control data, address data, and write data. Read/write control data controls whether a read or write operation should be performed. If read/write control data indicates that a write operation is to be performed, write data held in the scan register 31 is written into the address identified by the address data. If read/write control data indicates that a read operation is to be performed, the word stored in the identified address is transferred in parallel into a second scan register 38. Scan register 38 may then be scanned into a data compare circuit 28, along line 74 where the read data is compared against expected data to test the identified word.

Array logic 35 may further include a circuit 32 for detecting an address which is deeper than the address depth of the array 30. When such an out-of-bounds address is detected, array logic may ignore the requested operation, thereby preventing array 30 from inadvertently writing to or reading from an unidentified address. Data compare circuit 28 may also include logic for detecting an out-of-bounds address so that, in an out-of-bounds instance, a data compare operation may be ignored.

Figure 2:
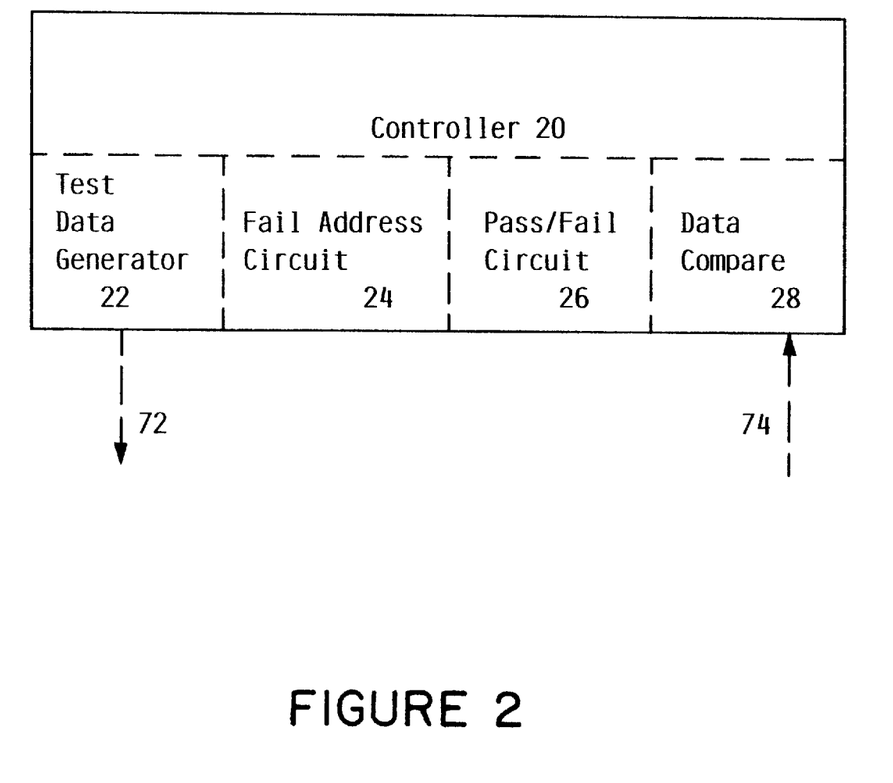
FIG. 2 is a block diagram illustrating further detail of the controller shown in FIG. 1.

Turning to FIG. 2, it can be seen that controller 20 may further include a failed address circuit 24 which includes one or more registers for capturing the address registers where data miscomparison occurs. Controller 20 may also include a pass/fail circuit 26 which includes one or more latches holding data bits indicative of whether a particular array 30 passed the built-in self-test. As is well known, the pass/fail bits and fail address registers may be scanned out for diagnostics.

Figure 3A:
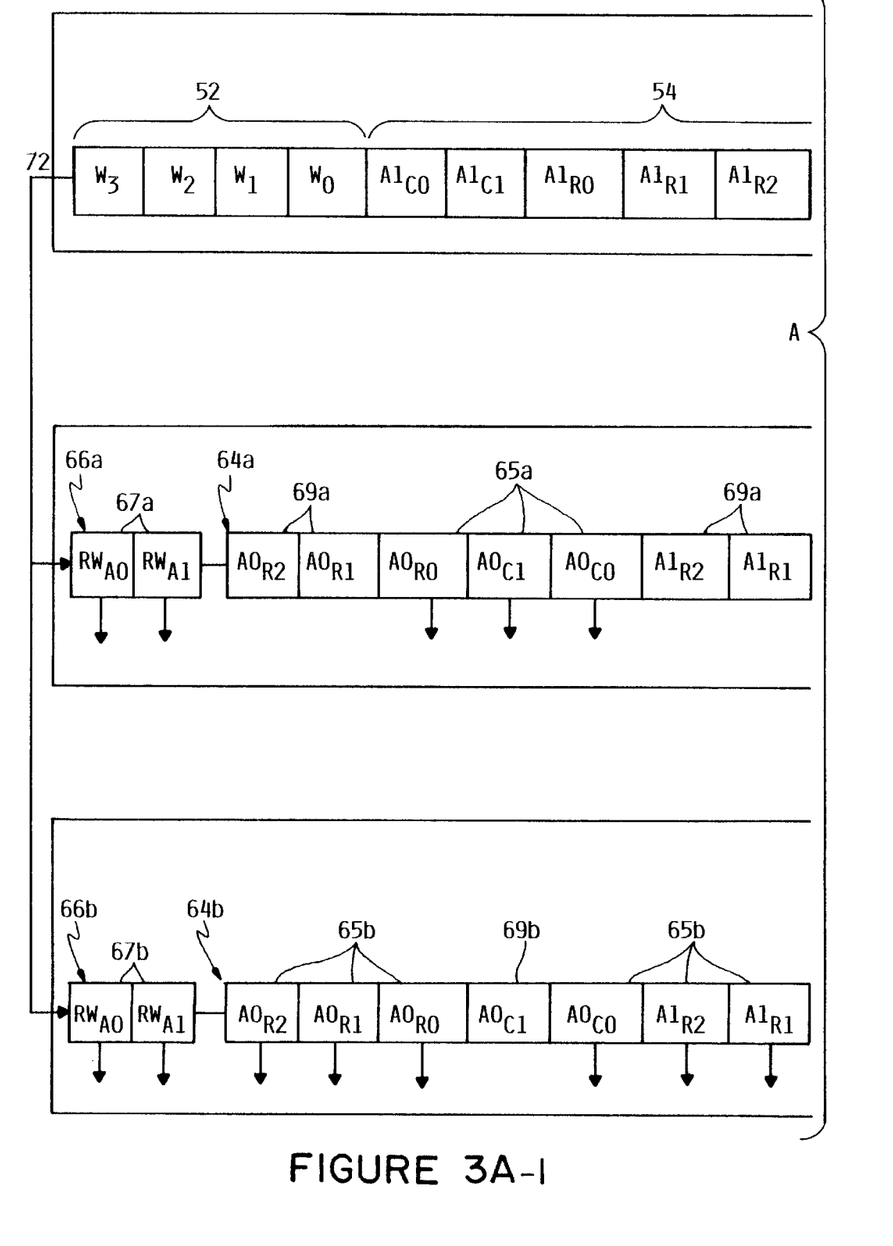
Figure 3A:
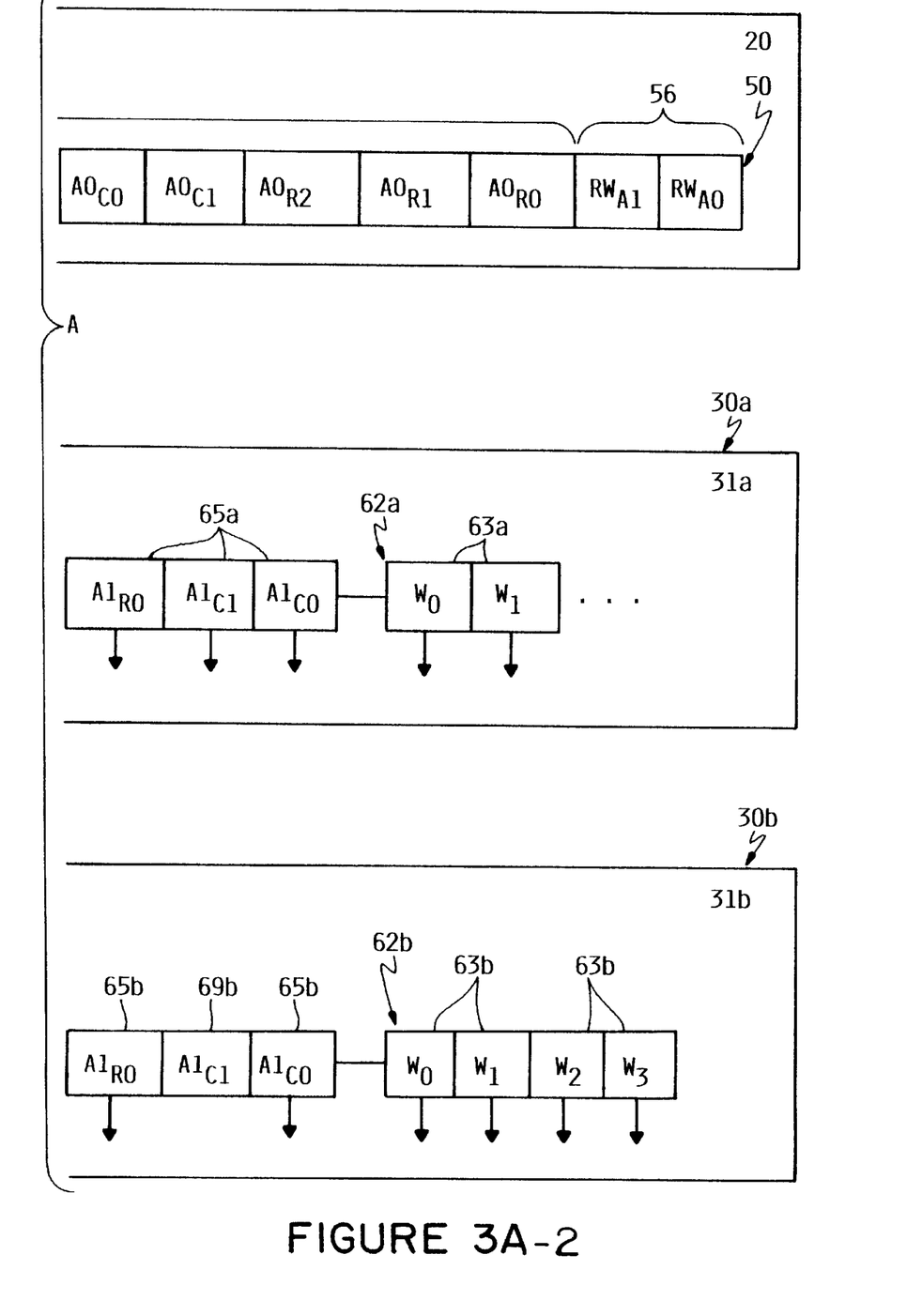
Figure 3B:
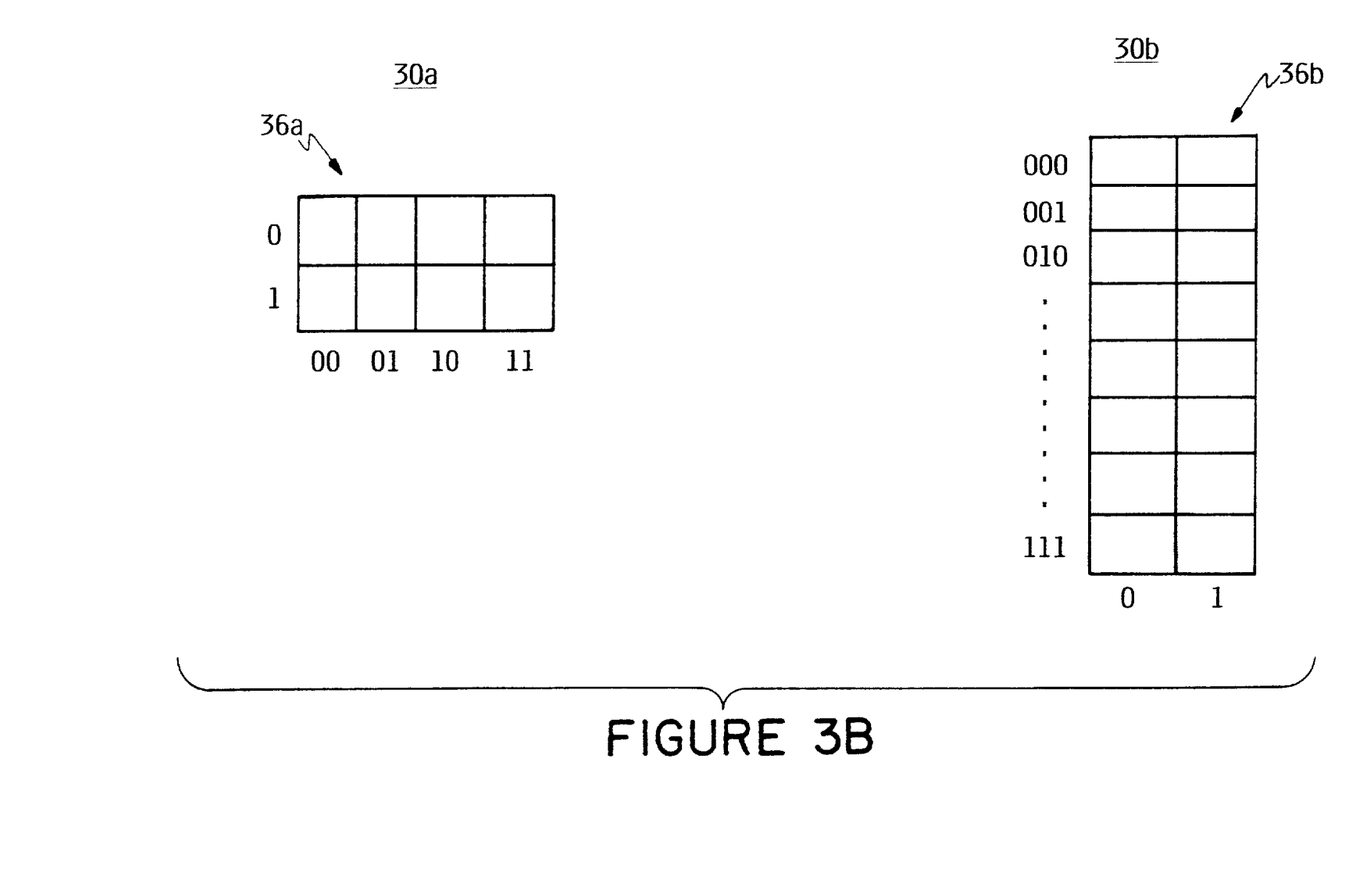
FIG. 3B is a diagram of the memory blocks of the arrays shown in FIG. 3A.

FIGS. 3A-1 through 3A-2 depict a block diagram which illustrates in more detail test data word 50 and memory arrays 30 shown in FIG. 1 of the drawings. For purposes of simplification, chip 10 is illustrated as having only two memory arrays: memory array 30a, an 8×2 array, which means it includes eight words, each word having a data word width of two bits; and memory array 30b, a 16×4 array. It is noted that the matrix of cells within an array block may have a number of configurations. In the exemplary embodiment as shown in FIG. 3B, array 30a comprises blocks 36a having a 2×4 configuration and thus a row address depth of 1 bit and a column address depth of 2 bits. Array 30b is shown to comprise blocks 36b having an 8×2 configuration and thus a 3 bit row address depth and a 1 bit column address depth. The maximum row address depth, i.e., the row address depth of the array having a row address depth equal to or greater than the row address depth of any other array, is three bits. The maximum column address depth, i.e., the column address depth of the array having a column address depth equal to or greater than the column address depth of any other array, is two bits.

In addition, in this exemplary embodiment, the maximum data word width, i.e., the data word width of the array having a data word width equal to or greater than the data word width of any other array, is four bits. However, it is noted that the number and size of the arrays illustrated herein is exemplary only and the invention is not limited thereby. More arrays may be provided on the integrated circuit, and the arrays may be smaller or larger in size.

Test data word 50 includes a write data block 52, an address data block 54 and a read/write data block 56. In the exemplary embodiment, address data block 54 includes a plurality of data bits for identifying a first binary address A0 and a second binary address A1. Read/Write data block 56 includes two data bits, a first bit $RW_{A0}$ for indicating the operation to perform on first address A0 and a second bit $RW_{A1}$ for indicating the operation to perform on second address A1. It is rioted that address data block 54 may hold only one binary address and/or read/write data block 56 may hold only one read/write bit. However, scanning out two addresses and two read/write data bits with each test data word 50 optimizes the test procedure as read data may be scanned out from arrays 30, concurrently with the scanning in of a new test data word 50.

Test data word 50 has a universal length for enabling its utilization by any array 30 on chip 10. For example, in the exemplary embodiment, the length of test data word 50 depends on the maximum row and column address depths and the maximum data word width.

More specifically, the length of read/write data block 56 depends on the number of addresses being sent in test data word 50. Where two address are sent, read/write data block includes two bits. The length of address block 54 depends upon the maximum row and column address depths. Where two addresses are sent, address block 54 has a length equivalent to twice the sum of the maximum row address depth and the maximum column address depth. Thus, in the exemplary embodiment, read/write data block 56 includes two data bits and address data block 54 includes ten data bits. Five data bits $A0_{R2}$–$A0_{R0}$ and $A0_{c1}$–$A0_{C0}$ represent the row address and column address of the first binary address A0 and five data bits $A1_{R2}$–$A1_{R0}$ and $A1_{c1}$–$A1_{C0}$ represent the second binary address A1. For reference, data bits $A0_{R2}$, $A1_{R2}$ and $A0_{c1}$, $A1_{c1}$ are the most significant row and column bits respectively and $A0_{R0}$, $A1_{R0}$ and $A0_{C0}$, $A1_{C0}$ are the least significant row and column bits.

The length of write data block 52 depends on the maximum data word width. Thus, in the exemplary embodiment, write data block 52 includes four write data bits $W_0$–$W_3$. Test data word 50 is arranged such that write data block 52 is scanned out first, followed by address data block 54, followed by read/write data block 56.

Each scan register 31a, 31b includes a read/write control data register 66a, 66b, serially linked to an address register 64a, 64b, which is serially linked to a write register 62a, 62b. Read/write registers 66a and 66b sit at the input end of scan registers 31a and 31b and write registers 62a and 62b sit at the opposite ends. Each read/write register 66a, 66b includes two read/write latches 67a, 67b for holding read/write data block 56 data bits.

Each address register 64a, 64b includes address latches 65a, 65b for holding address data bits which are needed to identify the addresses for array 30a and array 30b, respectively. Array 30a only utilizes the bits $A0_{R0}$, $A1_{R0}$, and $A0_{C0}$–$A0_{c1}$, $A1_{C0}$–$A1_{c1}$, to identify all of its addresses, and thus includes six latches 65a. Array 30b uses address bits $A0_{R0}$–$A0_{R2}$, $A1_{R0}$–$A1_{R2}$, and $A0_{C0}$, $A1_{C0}$ and thus includes eight latches 65b. Accordingly, the number of address latches 65a and 65b differs between the two arrays 30a and 30b as array 30b has a larger array size. To equalize the length of address registers 64a and 64b and thereby prevent address data bits from shifting into write latch registers 62a and 62b, dummy latches 69a and 69b are added to address registers 64a and 64b. Specifically, address register 64a is padded with dummy latches 69a to hold bits $A0_{R2}$, $A0_{R1}$, $A1^{R2}$, and $A1_{R1}$, the bits which are not needed to identify an address of array 30a. Similarly, address register 64b is padded with dummy latches 69b to hold bits $A0_{c1}$ and $A1_{c1}$.

Figure 8:
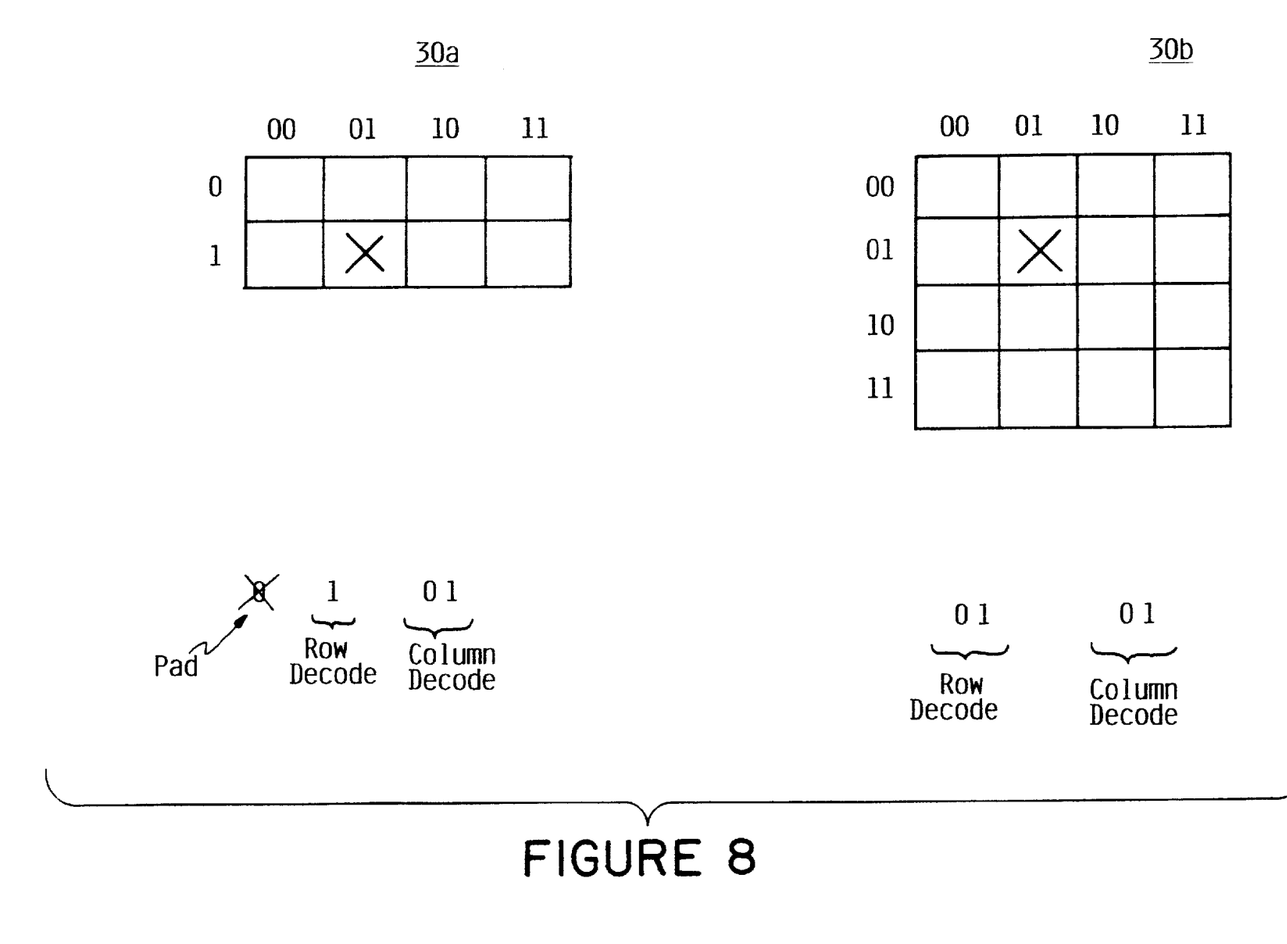
FIG. 8 is a diagram illustrating an alternate memory block configuration of the arrays shown in FIG. 3A.

It is noted that the length of the test data word and the number and position of the dummy latches varies with the configuration of the arrays. For example, as shown in the alternate embodiment of FIG. 8, array 30b may have a configuration comprising of 4×4 blocks, rather than the 2×8 blocks as shown in FIG. 3B, and array 30a may remain comprising 2×4 blocks. In this embodiment, the maximum row address depth is two bits and the maximum column address depth is two bits. Thus, to send two addresses, test data word need only comprise eight bits in this embodiment as opposed to ten bits in the earlier embodiment. Moreover, the position and number of dummy latches differs from the earlier embodiment. Specifically, array 30b requires no dummy latches and array 30a requires only two dummy latches, one dummy latch for holding the most significant row address data bit in each address.

Referring back to FIGS. 3A-1 through 3A-2, each write register 62a and 62b includes write latches 63a and 63b for holding write data bits which are written to an address. Array 30a needs only two bits of write data for testing, as its data word width is two bits. Thus, array 30a includes two write latches 63a. Similarly, array 30b requires four bits of write data, and thus includes four latches 63b. Accordingly, the number of write latches 63a and 63b differs between the two arrays 30a and 30b as array 30b has a larger data word width. To handle the variable data word widths without padding write register 62a with dummy latches, write latches 63a and 63b are positioned at the end of scan registers 31a and 31b, respectively. With such positioning, in arrays having a smaller data word width than the maximum data word width, write data falls off the end of the scan register. For example, when test data word 50 is scanned into scan register 31a, the first two test data bits $W_3$ and $W_2$ fall off the end of the scan register 31a. Write data bits $W_1$ and $W_0$ remain in scan register 31a and are held by write latches 63a for use in testing the array.

It is noted that test data word 50 may be arranged such that read/write data block 56 is scanned out before address data block 54, provided that the positions of address registers 64a, 64b are switched with read/write registers 66a, 66b in each scan register 31a, 31b. Moreover, write data block 52 need not be scanned first, provided that the scan registers 31 are appropriately arranged and the write latches of smaller arrays are padded with dummy write latches. Furthermore, it is noted that the illustrated arrangement of address data bits within address data block 54 is exemplary only, and may vary so long as the scan registers of each array are appropriately wired and padded.

Figure 4A:
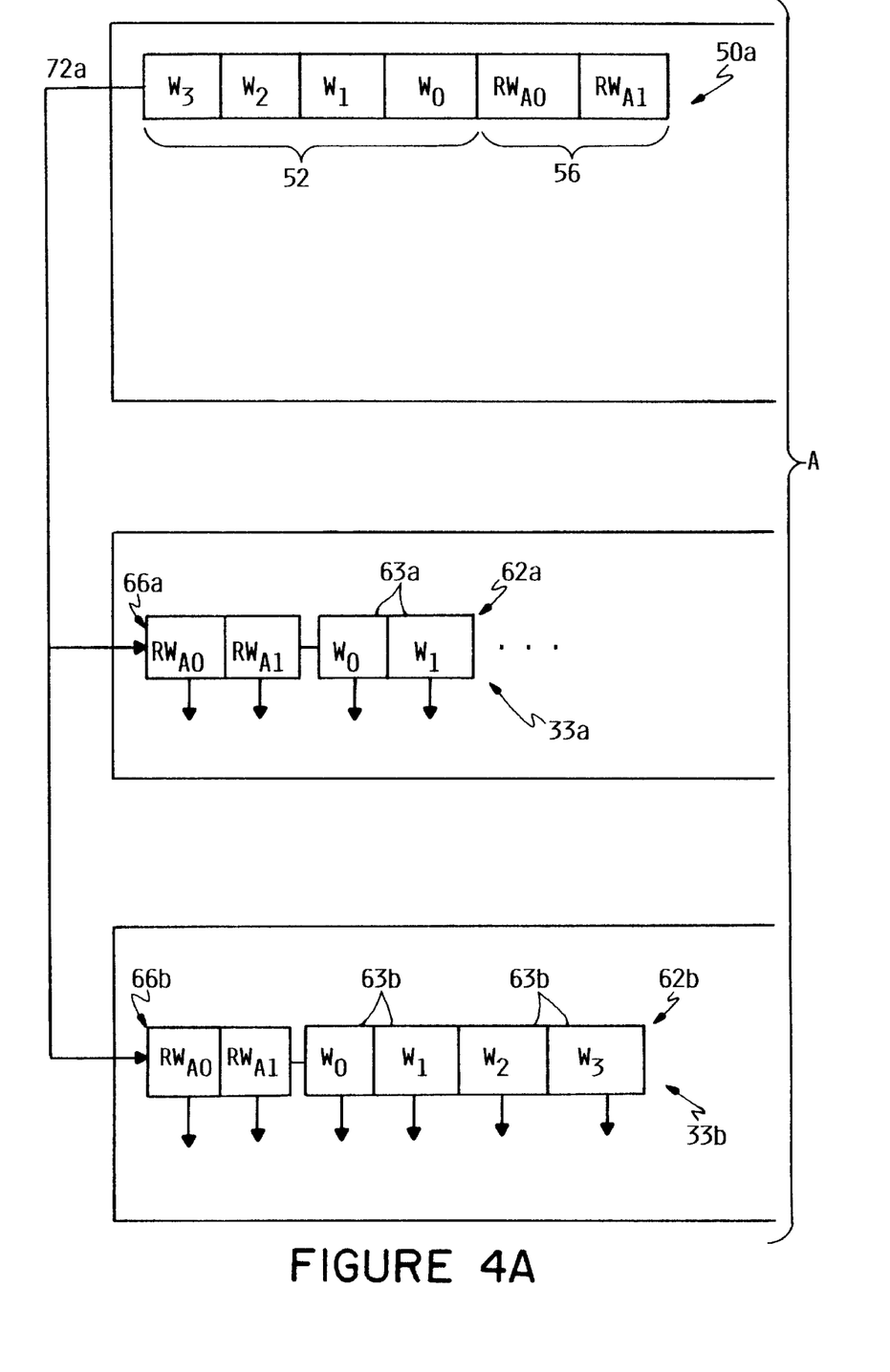
FIGS. 4A–4C depict a block diagram illustrating an alternate embodiment of the test data word and the memory arrays shown in FIG. 1.
Figure 4B:
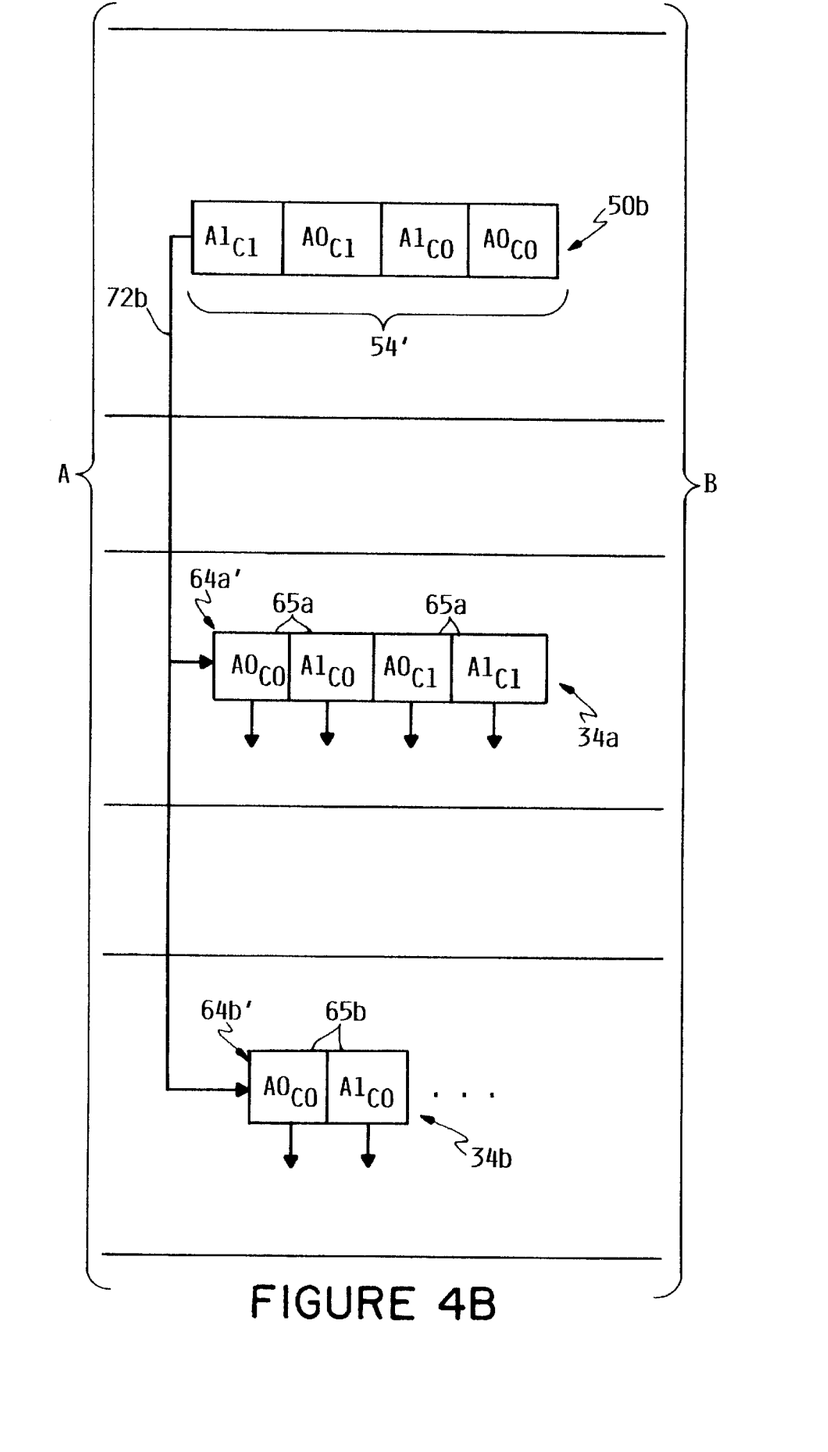
Figure 4C:
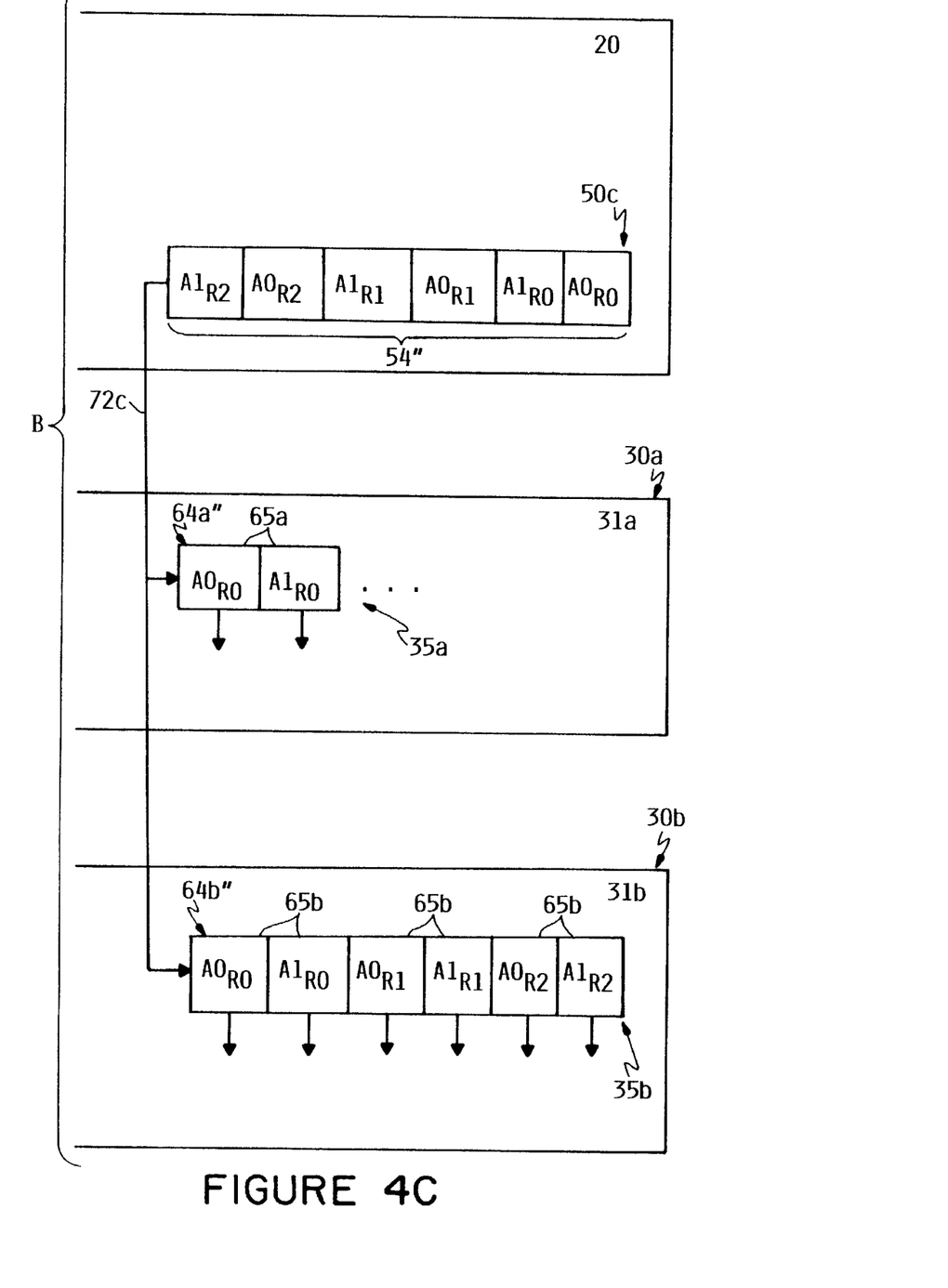

FIGS. 4A–4C illustrate a block diagram which illustrates an alternate configuration of test data word 50 and memory arrays 30 shown in FIG. 1 of the drawings. Test data word 50 is divided into three data words 50a, 50b, and 50c. Data word 50a includes write data block 52 and read/write data block 56. Address data block 54 is divided into a column address data block 54' and a row address data block 54". Data word 50b holds column address data block 54' and data word 50c holds row address data block 54". Data word 50a is scanned out on a first line 72a, data word 50b is scanned out on a second line 72b, and data word 50c is scanned out along a third line 72c. Data word 50a is arranged such that write data block 52 is scanned out first, followed by read/write block 56. Data words 50a, 50b, and 50c may be scanned out in parallel, thereby shortening the number of scan shifts required to send test data word 50 into arrays 30. For example, to scan out test data word 50 on a single line, sixteen scan shifts are required. However, in this embodiment, only six scan shifts are needed. Thus, multiple scan-out lines typically enable ABIST testing to be performed faster.

To receive lines 72a–72c, each scan register 31a and 31b is divided into three registers. Registers 33a and 33b receive line 72a and include read/write registers 66a and 66b serially linked to and followed by write registers 62a and 62b. Scan registers 34a and 34b comprise column address registers 64a' and 64b' and receive line 72b. Scan registers 35a and 35b comprise row address registers 64a" and 64b" and receive line 72c.

Similar to the previous embodiment, write register 62a includes two latches 63a and write register 62b includes four latches 63b. Moreover, write registers 62a and 62b are positioned at the end of registers 33a and 33b, respectively, such that in array 30a, write data falls off the end of register 33a.

Column address registers 64a' and 64b' include four address latches 65a and two address latches 65b, respectively. Row address registers 64a" and 64b" include two address latches 65a and six address latches 65b, respectively. However, unlike the previous embodiment address registers 64a', 64a", and 64b', 64b" are not padded with dummy latches. Instead, address data bits are arranged such that the bits within address data block 54' and 54" are scanned out in an alternating sequence beginning with the most significant bit. Within column address data block 54', the most significant column address bit of second address A1 is scanned out first, followed by the most significant column address bit of first address A0, followed by the second most significant column address bit of second address A1, etc. Within row address data block 54", the most significant row address bit of second address A1 is scanned out first, followed by the most significant row address bit of first address A0, followed by the second most significant row address bit of second address A1, etc.

For example, in the exemplary embodiment, column address data block 54' is arranged to scan out as follows:

$A1_{c1}, A0_{c1}, A1_{C0}, A0_{C0}$. By sending the most significant bits first, in smaller arrays, the more significant bits fall off the end of the address register and only address bits needed to identify an address remain. For example, in column address register 64b', bits $A0_{C0}$ and $A1_{C0}$ are held in latches 65a while bits $A0_{c1}$ and $A1_{c1}$ fall off.

It is noted that, in alternate embodiments using multiple scan out lines, read/write data block 56 may be scanned out after either address data block 54' or 54". Moreover, read/write data block 56 may be scanned out prior to either write data block 52 or address data block 54' or 54", provided that the corresponding write register or address register is appropriately arranged within scan register 31a and for 31b, and padded with dummy latches. Moreover, if the address registers are provided with dummy latches, it should be understood that within address data block 54' and/or 54", the bits may be arranged in any order.

Figure 5:
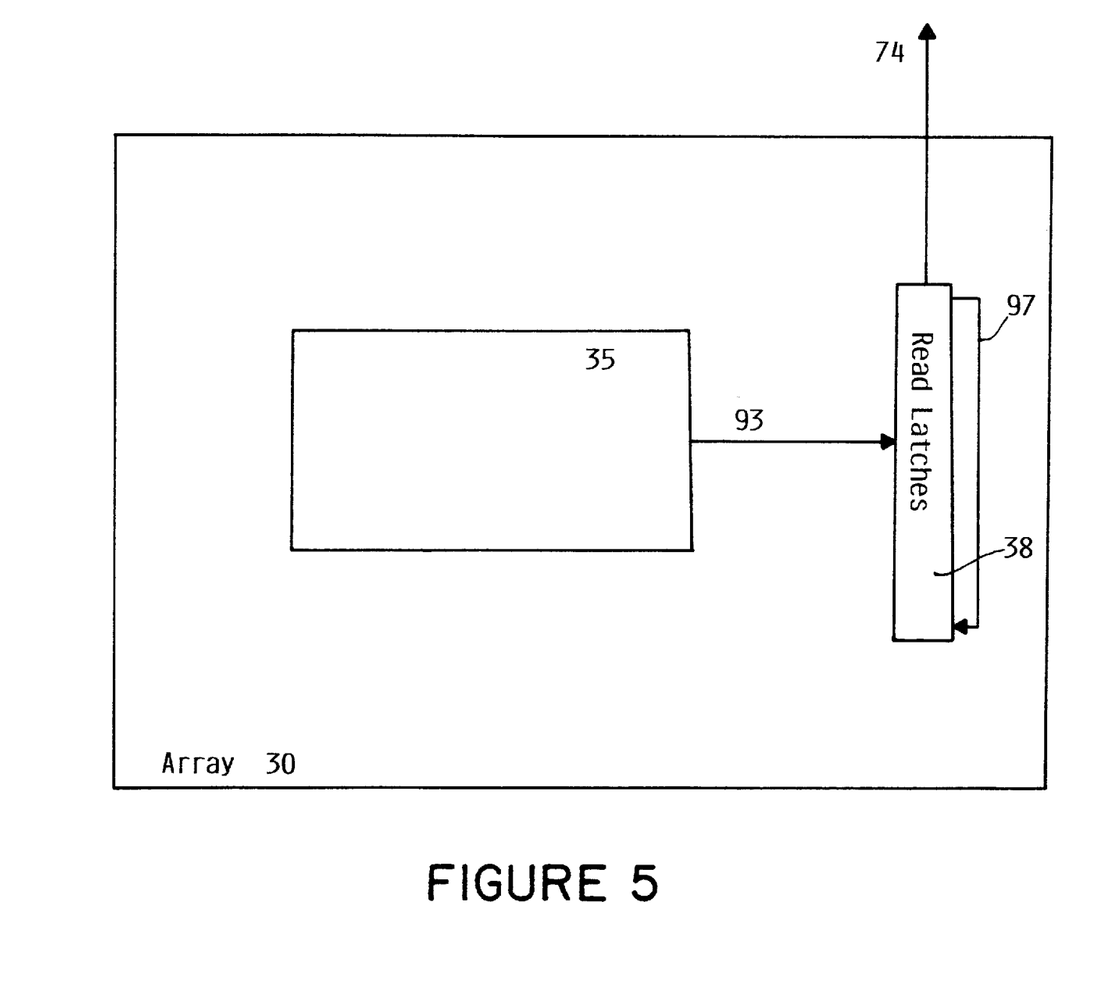
FIG. 5 is a block diagram illustrating exemplary read latches of an array shown FIG. 1.
Figure 6:
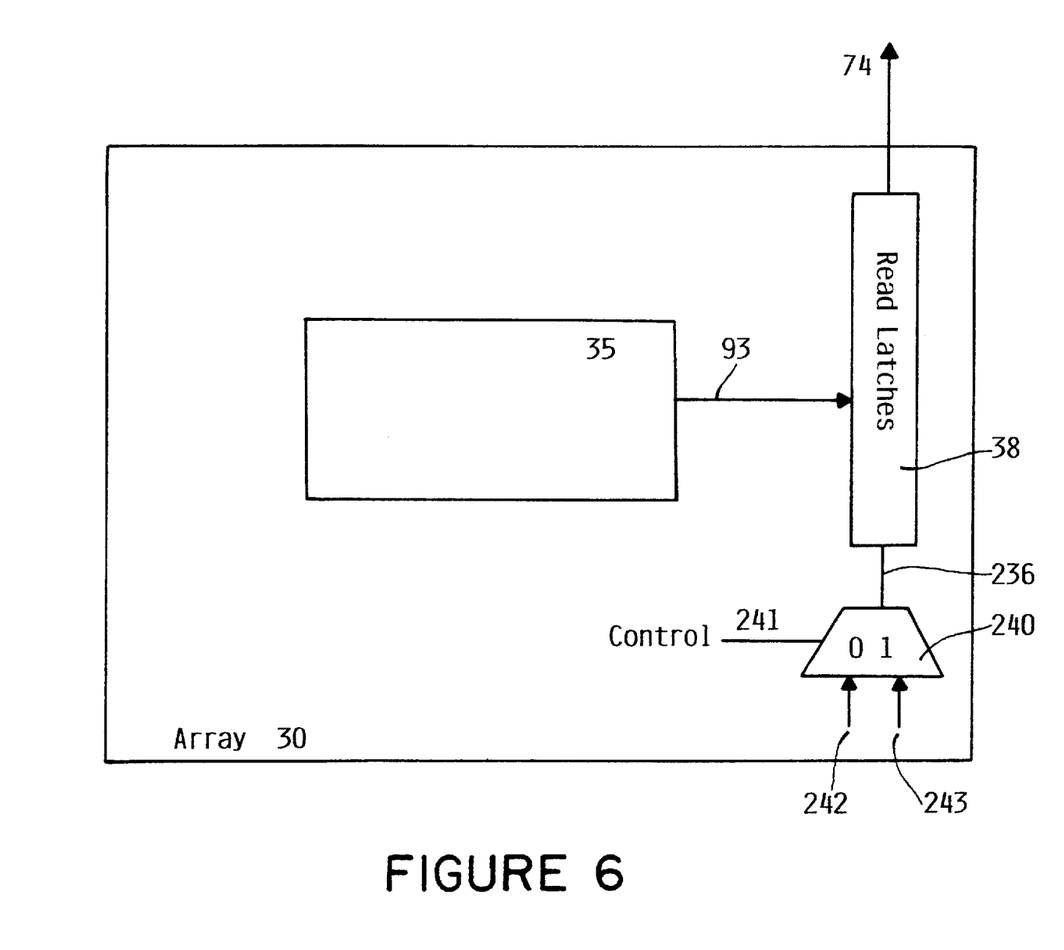
FIG. 6 is a block diagram illustrating alternate exemplary read latches of an array shown FIG. 1.

FIGS. 5 and 6 illustrate how read data may be scanned out of the scan registers and into controller 20. Each array 30 includes a scan register 38 having a plurality of read latches, the number of which corresponds to the data word width of the array. When a read command is indicated by read/write control data, array logic 35 uploads the read data in parallel from an identified address to scan register 38 via line 93.

Scan register 38 may then be scanned into controller 20 along line 74 concurrently with the scanning out of a test data word 50. It should be understood that the number of scan shifts needed to scan in test data word 50 is typically larger than the number of scan shifts needed to scan out the read latches of scan register 38. For example, array 30a requires two scan shifts to scan out scan register 38, yet where test data word 50 is scanned out along one line, sixteen scan shifts are pulsed.

To account for the extra scan shifts, the data path scanned into controller 20 may be padded with known data. The padded data may be provided by using a feedback loop 97, as shown in FIG. 5. Feedback loop 97 inputs each read data bit scanned out along line 74 back into a first read latch of register 38

As shown in FIG. 6, padded data may alternatively be provided using a multiplexer (mux) 240 having two input lines 242, 243 and an output line 236. Input line 242 may be tied to 0 and input line 243 may be tied to 1. Control signals 241 from array 30 control the output signal 236 of mux 240. Output signal 236 is serially scanned into read latches 38, thus padding the read data with known data. The use of both zeroes and ones allows full fault test capability, i.e., it ensures that the read latches are transitioning properly.

Figure 7A:
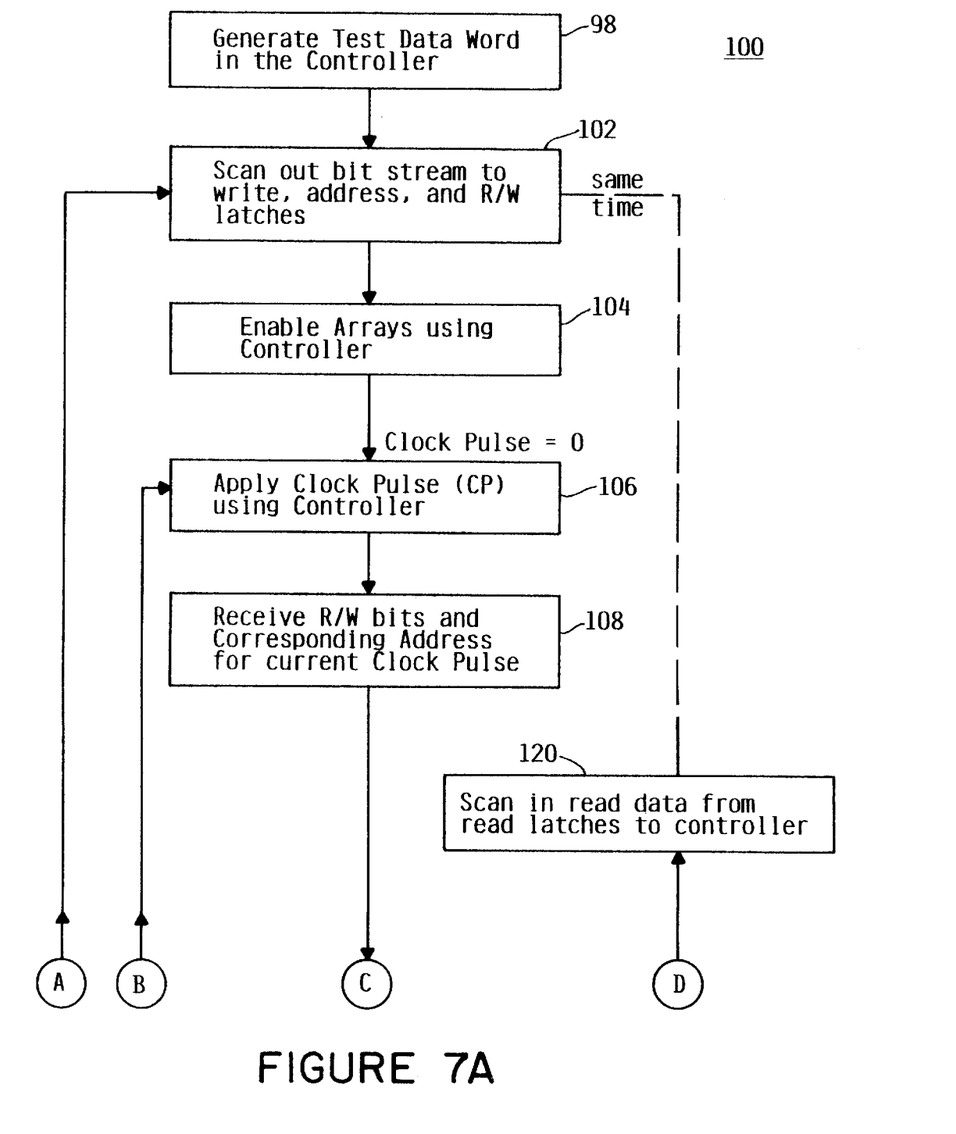
FIGS. 7A–7B depict a flow diagram illustrating the operation of the system of FIG. 1.
Figure 7B:
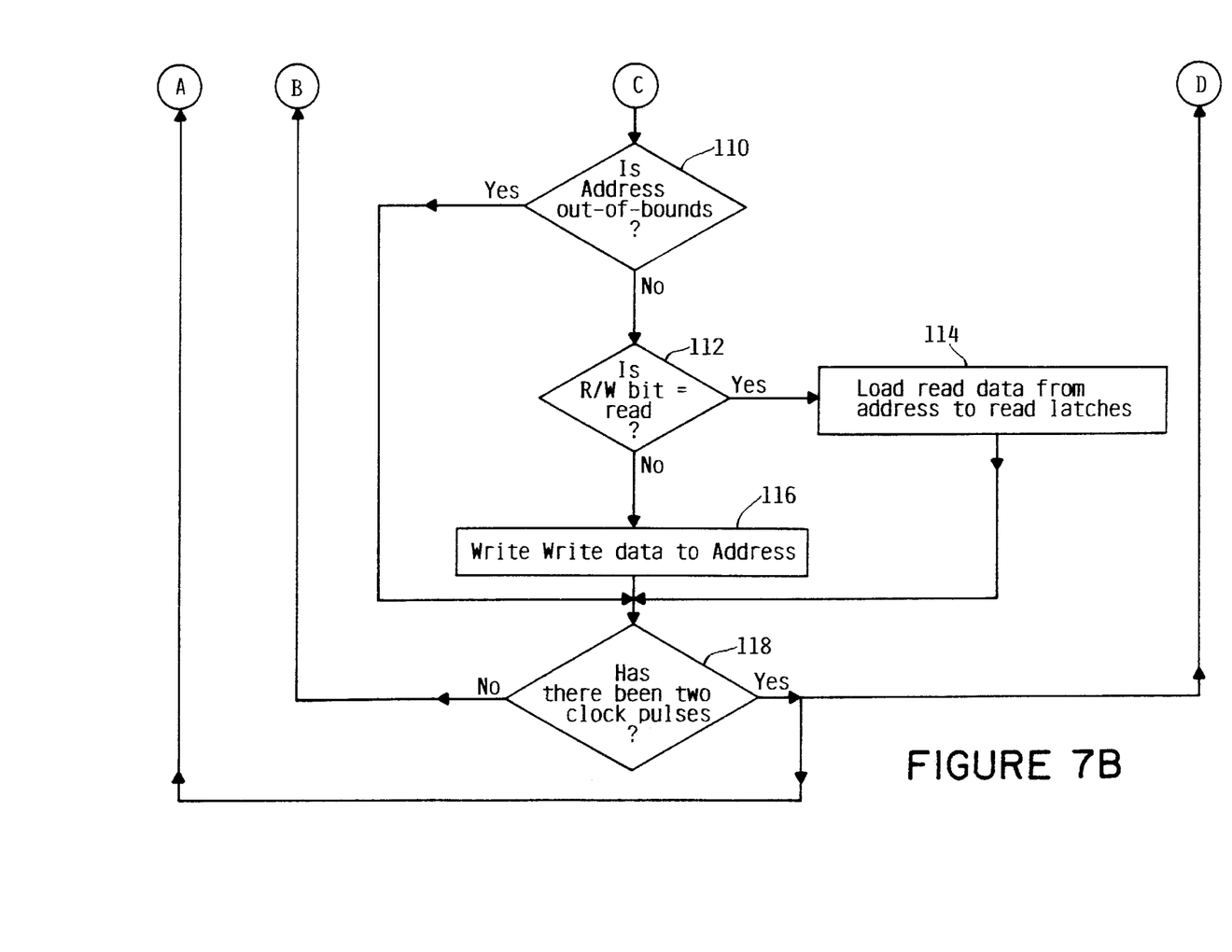

With reference to FIGS. 7A–7B, the invention will be further illustrated by explaining its operation through one test cycle. Controller 20 first generates a test data word 50, as indicated in block 98. Test data word 50 is then serially scanned out to the write, address, and read/write latches of each array, as indicated in block 102. Concurrently therewith, read data previously loaded into read data latches at block 114 may be scanned into the controller, as indicated in block 120.

At block 104, after the test data word 50 is scanned out of controller 20 and read latches are scanned into controller 20, the arrays are enabled by controller 20. At block 106, controller 20 applies a first clock pulse. As indicated at block 108, each array downloads the read/write control data block 52 and corresponding address data block 54 for the current clockpulse.

If the address identified by address block 54 is greater than the maximum address of an array, detection circuit 32 prevents the read/write operation from performing in that array and the system moves to block 118, as indicated in decision block 110. If the address is within bounds, the array determines if the requested operation is a read or write operation, as indicated in decision blocks 110 and 112.

If the read/write bit indicates a read operation, then the array loads read data from the specified address into its read latches, as indicated by decision block 112 and block 114. If the read/write bit indicates a write operation then the array writes the write data to the specified address, as indicated in decision block 112 and block 116.

After the read or write operation is performed, the operation proceeds to decision block 118, where it is determined if two clock pulses have been applied. If two clockpulses have not occurred then the operation loops back to block 106 where a second clock pulse is applied. If two clock pulses have been applied then the array is disabled and the operation loops back to block 98, where new test data is generated and the operation is repeated.

The embodiments described above are exemplary. It will, of course, be understood that various modification and additions can be made to the embodiments discussed hereinabove without parting from the scope or spirit of the present invention. Accordingly, the scope of the present invention should not be limited to the particular embodiments discussed above, but should be defined only by the full and fair scope of the claims set forth below.

What is claimed is:

1. A method for handling variable data word widths and array depths in an array built-in self-test system for testing a plurality of memory arrays using a single controller, wherein each array includes a scan register, comprising the steps of:

(a) generating a universal length test data word using the controller; and (b) sending the test data word to the scan register of each array using the controller.

2. The method of claim 1, wherein each array has a predetermined row address depth and column address depth, wherein at least one array has a maximum column address depth and at least one array has a maximum row address depth, the length of the test data word being dependent upon the maximum column address depth anid the maximum row address depth.

3. The method of claim 2, wherein the test data word comprises a row address data block and a column address data block, wherein each scan comprises a row address register and a column address register, the row address register and the column address register each having an end, and wherein the sending step (b) further comprises the step of shifting a portion of the row address data block off the row address register end in each array having a row address depth less than the maximum row address depth and shifting a portion of the column address data block off the column address register end in each array having a column address depth less than the maximum column address depth.

4. The method of claim 3, wherein the test data word further comprises a write data block and the scan register further comprises a write register, and wherein the sending step (b) comprises the steps of scanning the write data block into the write register along a first line, scanning the row address data block into the row address register along a second line, and scanning the column address data block into the column address register along a third line.

5. The method of claim 3, wherein the row address data block and the column address data block each comprise a most significant bit, wherein the row address data block is sent to the row address register with the most significant row address bit first and the column address data block is sent to the column address register with the most significant column address bit first.

6. The method of claim 5, wherein the data within the row address data block and the data within the column address data block are sent in an alternating sequence.

7. The method of claim 1, wherein each array has a predetermined data word width, and wherein at least one array has a maximum data word width, the length of the test data word being dependent upon the maximum data word width.

8. The method of claim 7, wherein the test data word comprises a write data block, wherein each scan register comprises a write register having an end, and wherein the sending step (b) further comprises the step of shifting a portion of the write data block off the end in each array having a data word width less than the maximum data word width.

9. The method of claim 2, wherein each array has a predetermined data word width, and wherein at least one array has a maximum data word width, the length of the test data word being dependent upon the maximum row address depth, the maximum column address depth and the maximum data word width.

10. The method of claim 9, wherein the test data word comprises an address data block and a write data block, each scan register comprises a write register serially linked to an address register, and the sending step (b) further comprises the step of serially scanning the write data block and the address data block into the scan register along a single input line.

11. The method of claim 10, wherein the scan register comprises an end, and wherein the serially scanning step comprises the step of shifting a portion of the write data block off the end of the scan register of each array having a data word width less than the maximum data word width.

12. The method of claim 10, wherein each address register has a length, the method further comprising the steps of:
adding dummy latches to the address register of each array which has a row address depth less than the maximum row address depth and adding dummy latches to the address register of each array which has a column address depth less than the maximum column address depth, wherein the dummy latches provide each array with an equal length address register; and
padding the address data block with dummy data bits to fill the dummy latches.

13. The method of claim 1, wherein each memory array further comprises read latches capable of holding read data, wherein the method of claim 1 further comprises the steps of:
scanning the read data out of the read latches; and
padding the read data with known data.

14. The method of claim 13, wherein the padding step further comprises the step of repeating at least a portion of the read data through the read latches.

15. The method of claim 1, wherein the test data word identifies an address on which to perform an operation, and the method of claim 1 further comprises the step of determining, for each array, whether the identified address exceeds the address depth the array.

16. An apparatus for handling variable data word widths and array depths in an array built-in self-test system for testing a plurality of memory arrays using a single controller, wherein each array includes a scan register, the apparatus comprising:

a test data generator for generating a universal length test data word; and
means for sending the test data word to the scan register of each array.

17. The apparatus of claim 16, wherein each array has a predetermined row address depth and column address depth, wherein at least one array has a maximum column address depth and at least one array has a maximum row address depth, the length of the test data word being dependent upon the maximum column address depth and the maximum row address depth.

18. The apparatus of claim 17, wherein the test data word comprises a row address data block and a column address data block, wherein each scan register comprises a row address register and a column address register, the row address register and the column address register each having an end, and wherein the sending means comprises shifting means for shifting a portion of the row address data block off the row address register end in each array having a row address depth less than the maximum row address depth and shifting a portion of the column address data block off the column address register end in each array having a column address depth less than the maximum column address depth.

19. The apparatus of claim 18, wherein the test data word further comprises a write data block and the scan register further comprises a write register, and wherein the sending means comprises a first line for sending the write data block into the write register, a second line for sending the row address data block into the row address register, and a third line for sending the column address data block into the column address register.

20. The apparatus of claim 18, wherein the row address data block and the column address data block each comprise a most significant bit, wherein the row address data block is sent to the row address register with the most significant row address bit first and the column address data block is sent to the column address register with the most significant column address bit first.

21. The apparatus of claim 20, wherein the data within the row address data block and the data within the column address data block are sent in an alternating sequence.

22. The apparatus of claim 16, wherein each array has a predetermined data word width, and wherein at least one array has a maximum data word width, the length of the test data word being dependent upon the maximum data word width.

23. The apparatus of claim 22, wherein the test data word comprises a write data block, wherein each scan register comprises a write register having an end, and wherein the sending means comprises shifting means for shifting a portion of the write data block off the end in each array having a data width with less than the maximum data word width.

24. The apparatus of claim 16, wherein each array has a predetermined data word width, and wherein at least one array has a maximum data word width, the length of the test data word being dependent upon the maximum row address depth, the maximum column address depth and the maximum data word width.

25. The apparatus of claim 24, wherein the test data word comprises an address data block and a write data block, wherein each scan register comprises a write register serially linked to an address register, and wherein the sending means comprises a single input line for sending the write data block and the address data block into the scan register.

26. The apparatus of claim 25, wherein the scan register comprises an end, and wherein, the sending means comprises shifting means for shifting means for shifting a portion of write data block off the end of the scan register in each array having a data word width less than the maximum data word width.

27. The apparatus of claim 23, wherein each address register has a length, and wherein, in each array which has a row address depth less than the maximum row address depth the address register of comprises dummy latches and, in each array which has a column address depth less than the maximum column address depth, the address register comprises dummy latches, such that the length of all address registers is equal, and wherein the address data block comprises dummy data bits for filling the dummy latches.

28. The apparatus of claim 16, wherein each memory array further comprises read latches capable of holding read data, the apparatus further comprising;

scanning means for scanning the read data out of the read latches; and padding means for padding the read data with known data.

29. The apparatus of claim 28, wherein the padding means comprises a feedback means for repeating at least a portion of the read data through the read latches.

30. The apparatus of claim 16, wherein the test data word comprises a binary address on which to perform an operation, the apparatus further comprising a determining means for determining, for each array, whether the identified address exceeds the address depth of the array.

* * * * *